United States Patent
Takase et al.

(10) Patent No.: US 7,800,967 B2
(45) Date of Patent: Sep. 21, 2010

(54) SEMICONDUCTOR MEMORY DEVICE AND DRIVING METHOD THEREOF

(75) Inventors: Satoru Takase, Yokohama (JP); Shigeo Ohshima, Mt. View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/324,953

(22) Filed: Nov. 28, 2008

(65) Prior Publication Data
US 2009/0175077 A1 Jul. 9, 2009

(30) Foreign Application Priority Data
Nov. 29, 2007 (JP) .............................. 2007-308993

(51) Int. Cl.
G11C 7/00 (2006.01)
(52) U.S. Cl. .................. 365/206; 365/207; 365/208
(58) Field of Classification Search .............. 365/206, 365/207, 208
See application file for complete search history.

(56) References Cited

U.S. PATENT DOCUMENTS

| | | | |
|---|---|---|---|
| 6,587,392 B2 * | 7/2003 | Ooishi | ................... 365/230.03 |
| 7,257,032 B2 | 8/2007 | Fujiu et al. | |
| 2006/0007774 A1 | 1/2006 | Zanardi et al. | |
| 2006/0179263 A1 | 8/2006 | Song et al. | |
| 2006/0250849 A1 * | 11/2006 | Ichige et al. | ........... 365/185.17 |
| 2007/0168632 A1 | 7/2007 | Zeevi et al. | |

OTHER PUBLICATIONS

U.S. Appl. No. 12/202,601, filed Sep. 2, 2008, Satoru Takase, et al.

* cited by examiner

*Primary Examiner*—Son Dinh
(74) *Attorney, Agent, or Firm*—Oblon, Spivak, McClelland, Maier & Neustadt, L.L.P.

(57) ABSTRACT

This disclosure concerns a memory including: word lines extending to a first direction; bit lines extending to a second direction crossing the first direction; a memory cell array including cell blocks each including memory cells respectively provided corresponding to intersection points of the word lines and the bit lines; and sense amplifiers provided corresponding to the bit lines, wherein the sense amplifiers copies existing data stored in a first cell block within the memory cell array to a plurality of memory cells, the memory cells being included in second and third cell blocks different from the first cell block, and alternately arranged in an extension direction of the word lines and also alternately arranged in an extension direction of the bit lines, and the sense amplifiers reads data from the second cell block or the third cell block, at a time of outputting data to outside of the sense amplifiers.

16 Claims, 6 Drawing Sheets

SEMICONDUCTOR MEMORY DEVICE AND DRIVING METHOD THEREOF

CROSS-REFERENCE TO RELATED APPLICATION

This application is based upon and claims the benefit of priority from the prior Japanese Patent Application No. 2007-308993, filed on Nov. 29, 2007, the entire contents of which are incorporated herein by reference.

BACKGROUND OF THE INVENTION

1. Field of the Invention

The present invention relates to a semiconductor memory device and a driving method thereof.

2. Related Art

In recent years, nonvolatile memories such as NAND flash memory have been further miniaturized. When an interval between adjacent memory cells becomes small, along with the miniaturization of devices, proximity effect between the memory cells becomes distinctive. The proximity effect is interference that memory cells receive from adjacent memory cells due to capacitance coupling between adjacent plural memory cells and the like. For example, data stored in the memory cells receives influence of charge accumulated in memory cells adjacent to the memory cells storing the data. When the interval between the adjacent memory cells becomes smaller, the influence of the charge in the adjacent memory cells becomes large.

When the influence of the proximity effect becomes distinctive, a noise component contained in a cell current at the data reading time and back pattern noise which looks like a change of the cell current depending on data written in the cells become large. Further, when a processing size of a memory cell array is miniaturized, the nose component becomes relatively large when the cell current is small. When noise in the cell current is large, time required for a sense amplifier to sense data increases. Further, when noise in the cell current is large, there is a risk that the sense amplifier erroneously detects data.

SUMMARY OF THE INVENTION

A semiconductor memory device according to an embodiment of the present invention comprises a plurality of word lines extending to a first direction; a plurality of bit lines extending to a second direction crossing the first direction; a memory cell array including a plurality of cell blocks each including a plurality of memory cells respectively provided corresponding to intersection points of the word lines and the bit lines; and sense amplifiers provided corresponding to the bit lines, the sense amplifiers reading data stored in the memory cells, or writing data into the memory cells, wherein the sense amplifiers copies existing data stored in a first cell block within the memory cell array to a plurality of memory cells, the memory cells being included in second and third cell blocks different from the first cell block, and alternately arranged in an extension direction of the word lines and also alternately arranged in an extension direction of the bit lines, and the sense amplifiers reads data from the second cell block or the third cell block, at a time of outputting data to outside of the sense amplifiers.

A method of driving a semiconductor memory device according to an embodiment of the present invention, the semiconductor memory device including: a plurality of word lines extending to a first direction; a plurality of bit lines extending to a second direction crossing the first direction; a memory cell array including a plurality of cell blocks each including a plurality of memory cells respectively provided corresponding to intersection points of the word lines and the bit lines; and sense amplifiers provided corresponding to the bit lines, the method comprises: sensing existing data using the sense amplifier, the data being stored in a first block within the memory cell array; writing the existing data into a plurality of memory cells using the sense amplifier, the memory cells being included in second and third cell blocks different from the first cell block and being alternately arranged in an extension direction of the word lines and also alternately arranged in an extension direction of the bit lines, and reading data from the second cell block or the third cell block, at a time of outputting data to outside of the sense amplifiers.

DETAILED DESCRIPTION OF THE INVENTION

An embodiment of the present invention will be explained below in detail with reference to the accompanying drawings. Note that the invention is not limited thereto.

As described above, when miniaturization of devices is progressed, the proximity effect due to the coupling effect between adjacent plural memory cells becomes distinct.

The proximity effect is smaller in memory cells adjacent in a direction (a diagonal direction) inclined to a column direction or a row direction, than in memory cells adjacent in an extension direction (a column direction or a row direction) of bit lines or word lines. According to one embodiment of the present invention, at a data writing time or a data reading time, the sense amplifier accesses memory cells adjacent in a diagonal direction in a lattice shape configured by the word lines and the bit lines, in a state that data in the memory cells adjacent in a column direction and a row direction of a memory cell array are fixed. With this arrangement, the proximity effect can be suppressed, thereby enabling the sense amplifier to perform a high-speed reading and a high-speed writing.

Further, in the present embodiment, the sense amplifier accesses bit lines provided alternately when a certain word line is being selected. Accordingly, the shield effect by a non-access bit line suppresses erroneous detections of data.

Figure 1:
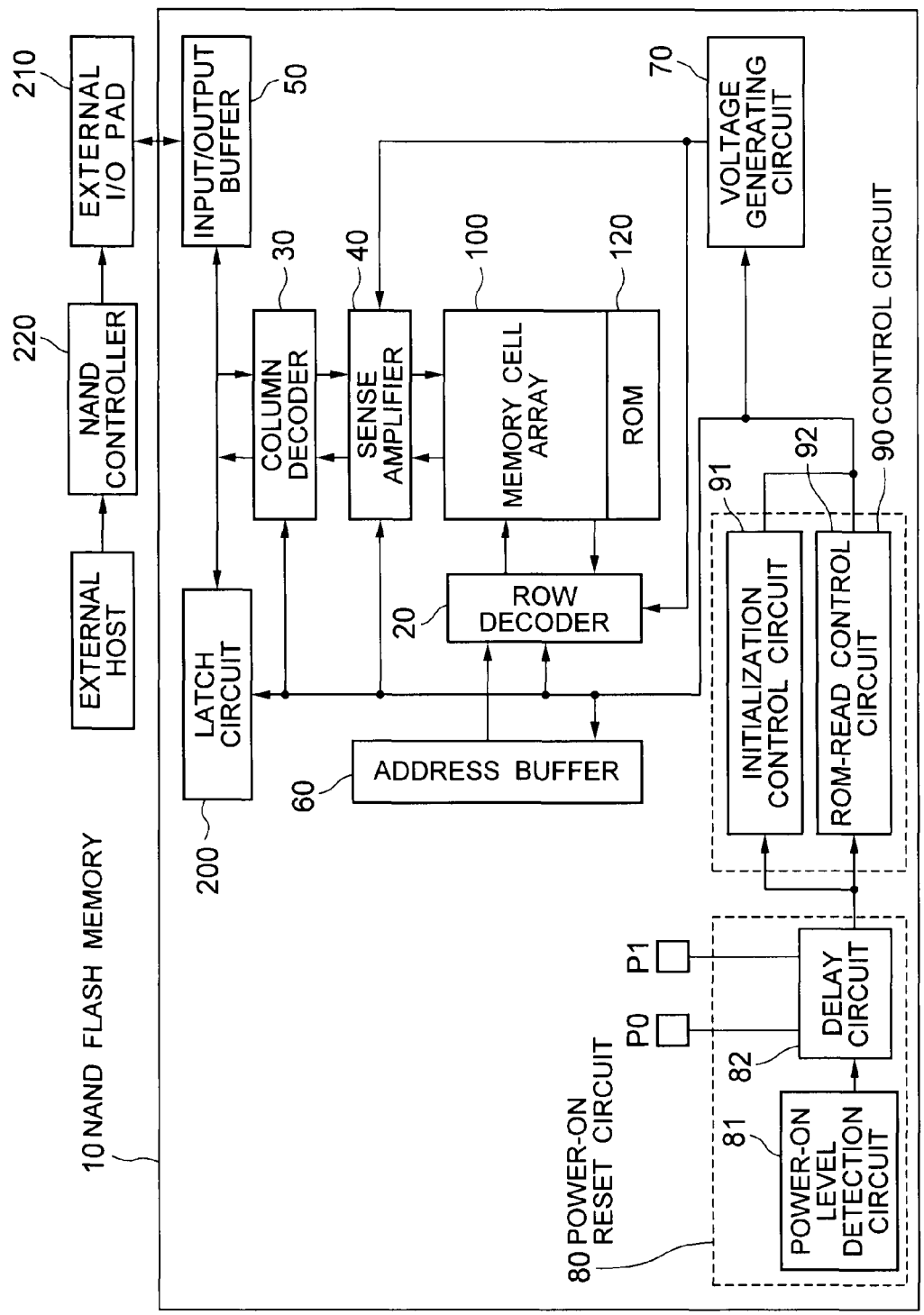
FIG. 1 is a block diagram showing one example of a configuration of a NAND flash memory 10 according to the embodiment.

FIG. 1 is a block diagram showing one example of a configuration of a NAND flash memory 10 (hereinafter, simply called "memory 10") according to the embodiment. The memory 10 includes a memory cell array 100, a row decoder 20, a column decoder 30, a sense amplifier group 40 (including a bit-line driving circuit), an input/output buffer 50, an address buffer 60, a voltage generating circuit 70, a power-on reset circuit 80, a control circuit 90, a latch circuit 200, an external I/O pad 210, and a NAND controller 220. The memory 10 further includes a state machine, a command interface or the like, which are not shown in FIG. 1.

The NAND controller 220 outputs data and a control signal (command). The NAND controller 220 can be built into a card together with the memory 10. The data and the control signal are input to the input/output buffer 50 via the external pad. The input/output buffer 50 transmits the data and the control signal to the command interface and the column decoder 30. The state machine controls the column decoder 30 and the row decoder 20 based on the data and the control signal. The row decoder 20 decodes the control signal, and selects a certain word line based on the address signal. The column decoder 30 is provided between the sense amplifier group 40 and a data bus. The column decoder 30 selects a sense amplifier, transfers read data latched by the selected sense amplifier to the data bus, or transfers data received from the outside to the selected sense amplifier.

At the data writing time, the sense amplifier once latches data, and writes this data into memory cells connected to a selective word line via a bit line of the column. At the data reading time, the sense amplifier detects data in the memory cells connected to the selective word line. The sense amplifier outputs the read data to the outside of the memory 10 via the input/output buffer 50 and the external I/O pad 210. The sense amplifier writes or reads data in a page unit including 8-bit data or 16-bit data, for example.

The address buffer 60 receives address information from the outside, encodes the address information, and transmits the encoded address information to the row decoder 20 and the column decoder 30.

The voltage generating circuit 70 receives a mode signal, a voltage-generation-timing control signal, and a voltage-level setting signal from the control circuit 90. The voltage generating circuit 70 generates an internal voltage such as a reference voltage Vref for reference, and a program voltage Vpgm, using a power source voltage VCC supplied from the outside. The voltage generating circuit 70 supplies the internal voltage to the row decoder 20, the column decoder 30, and the sense amplifier group 40.

The power-on reset circuit 80 detects a turning on of a power source, and outputs a signal to perform an initialization operation by resetting a register of the control circuit 90. The power-on reset circuit 80 outputs a power-on reset signal becoming at a low level after the power source is turned on until when a power source voltage reaches a predetermined voltage level, and becoming at a high level when the power source voltage reaches a predetermined voltage level.

The control circuit 90 generates a mode signal showing a data read operation, a data write operation, and a data erasing operation following a command received from the outside. The control circuit 90 also outputs a timing control signal showing a timing of generating a voltage necessary in each mode, a voltage setting signal showing a setting voltage stored in a register, an address control signal, and an access control signal to memory cells. A initialization control circuit 91 receives the power-on reset signal, and outputs a control signal to initialize the address buffer 60, the row decoder 20, the column decoder 30, the sense amplifier group 40, the latch circuit 200, and the voltage generating circuit 70. A ROM-read control circuit 92 receives the power-on reset signal, and outputs a control signal to start a ROM read operation.

A ROM 120 stores trimming data to adjust a timer and adjust various voltages, various data (fuse data) necessary to be read after the power source is turned on, and replacement address data (redundancy data) to replace defective cells present in the memory cell array 100 with other redundant cells. The fuse data and the redundancy data stored in the ROM 120 are transmitted to the latch circuit 200 via the sense amplifier group 40 and the column decoder 30, and are held in the latch circuit 200. This operation is called a ROM read operation.

The sense amplifier group 40 includes plural sense amplifiers provided corresponding to each bit line BL. Each sense amplifier reads data stored in the memory cells MCs or writes data into the memory cells MCs, via the bit lines BLs. Each sense amplifier has a latch function, and is configured to be able to temporarily hold read data or data to be written.

Figure 2:
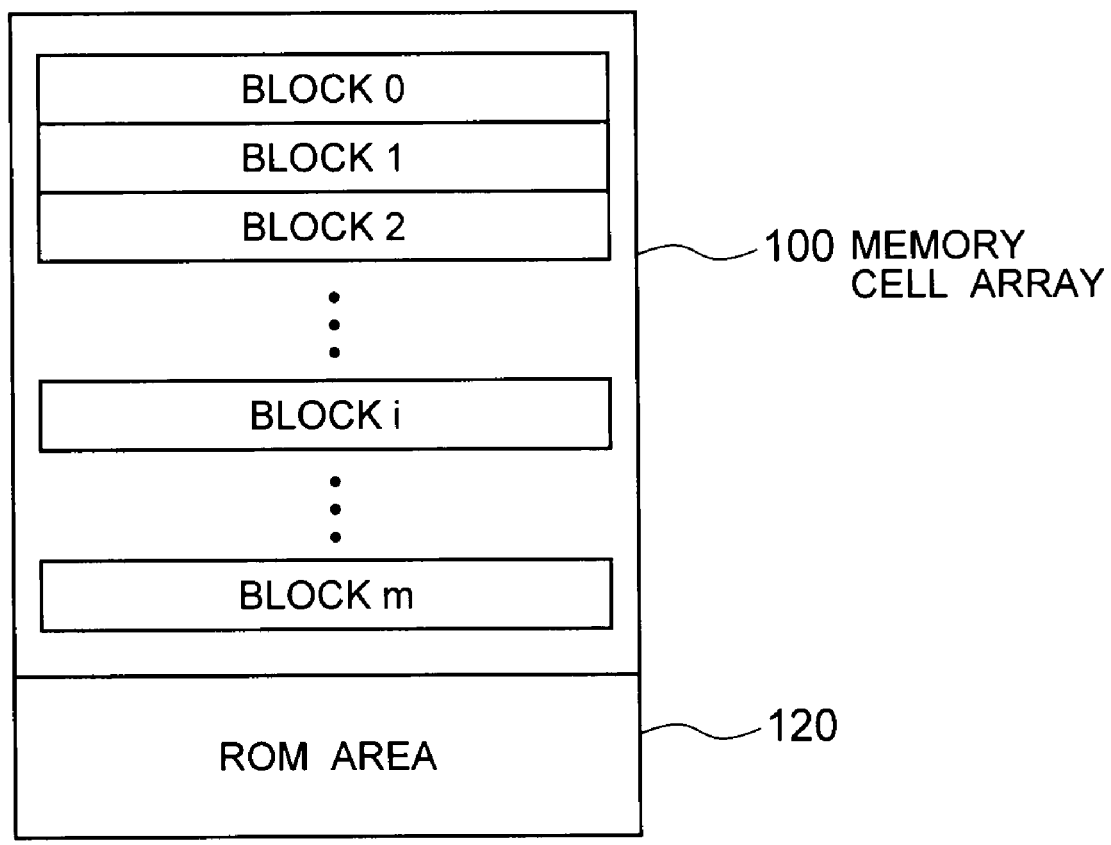
FIG. 2 shows one example of the memory cell array 100.

FIG. 2 shows one example of the memory cell array 100. The memory cell array 100 is divided into memory cell blocks (hereinafter, also called blocks) BLOCK0 to BLOCKm. In this example, each of BLOCK0 to BLOCKm is a minimum unit of data erasure. A block can be configured by an optional number of memory cells. Each of BLOCK0 to BLOCKm is configured by plural pages. A page is a unit of data reading/data writing. Each page corresponds to a word line, and is configured by data of plural memory cells specified by a certain row address.

Figure 3:
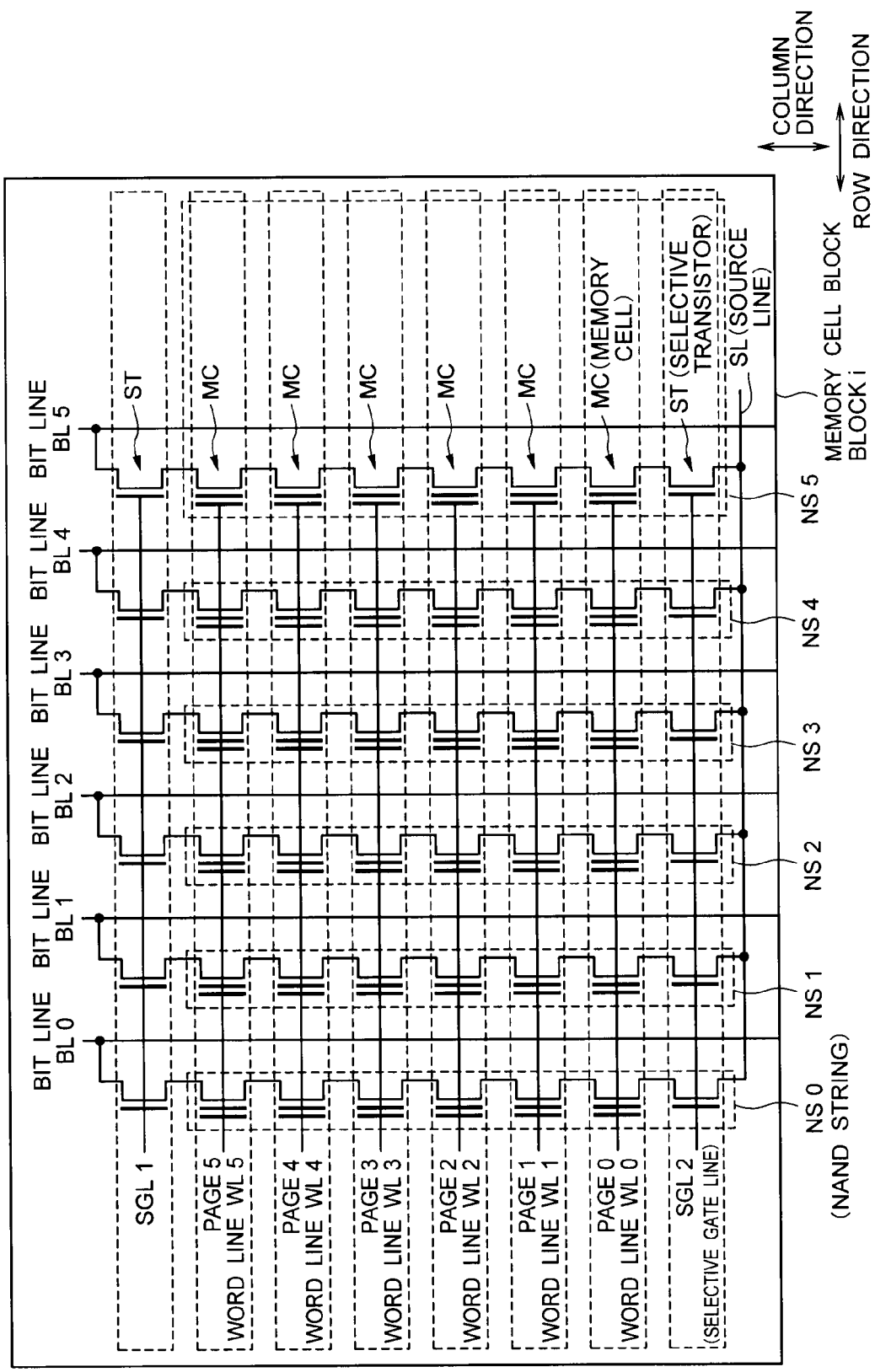
FIG. 3 shows one example of configurations of the respectively blocks BLOCK0 to BLOCKm.

FIG. 3 shows one example of configurations of the respectively blocks BLOCK0 to BLOCKm. A certain block BLOCKi (i=0 to m) includes plural NAND strings NSs provided corresponding to a bit line BL of each column. Each NAND string NS is formed by plural memory cells MCs connected in series, and selective gate transistors STs connected to both ends of these memory cells MCs. One end of each NAND string NS is connected to a corresponding bit line BL, and the other end of the NAND string NS is connected to a common source line SL. For example, a NAND string NSi (i=0 to 5) is connected to a bit line BLi (i=0 to 5). Although not shown in FIG. 3, plural NAND strings NSs are connected to one bit line BL via the selective transistor ST.

A control gate of the memory cell MC is connected to the word line WL of a page to which this memory cell MC belongs. For example, a control gate of the memory cell MC belonging to a page i (i=0 to 5) is connected to a word line WLi (i=0 to 5). A gate of the selective transistor ST is connected to a selective gate SGL1 or SGL2. By selecting the gate lines SGL1 and SGL2, only a corresponding NAND string NS is selectively connected to the bit line BL.

Plural word lines WLs are extended to a row direction as a first direction, and plural bit lines BLs are extended to a column direction as a second direction substantially orthogonally crossing a row direction. The row direction and the column direction are called as such for the sake of convenience, and the first direction can be a column direction, and the second direction can be a row direction.

As shown in FIG. 3, each memory cell MC is provided corresponding to an intersection in a lattice shape configured by the word line WL and the bit line BL. For example, intersections in a lattice shape configured by the word lines WL0 to WL5 and the bit lines BL0 to BL5 are positioned in a matrix shape of 6×6. The memory cells MCs are two-dimensionally arranged in a matrix shape of 6×6 to correspond to these intersections. While each block according to the present embodiment includes 6×6 (36) memory cells, the number of memory cells MCs within one block is not limited to this number. That is, the number of word lines and the number of bit lines are not limited to six, respectively.

The memory cells MCs are configured by an n-type FET (Field-Effect Transistor) having a floating gate and a control gate. A word line gives a potential to the control gate, and accumulates a charge (electrons) in the floating gate, or discharges a charge (electrons) from the floating gate. With this arrangement, data are written into the memory cells MCs, or data are erased from the memory cells MCs. The memory cells MCs can electrically store binary data or multi-value data, based on the number of charges (electrons) accumulated in the floating gate.

Figure 4:
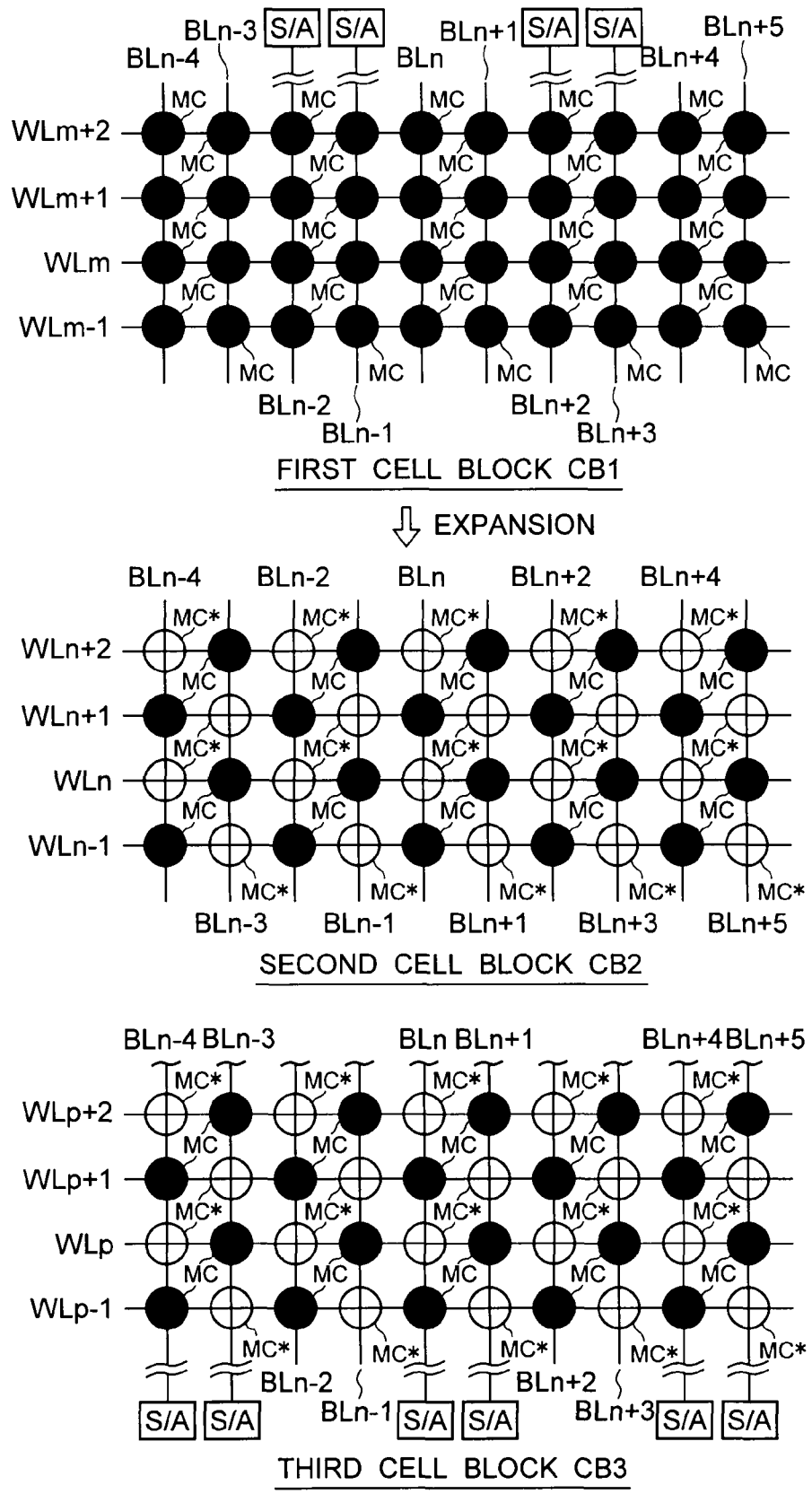
FIG. 4 is a concept diagram showing a driving method of the memory 10 according to the present embodiment.

FIG. 4 is a concept diagram showing a driving method of the memory 10 according to the present embodiment. In FIG. 4, the memory cells MCs are displayed as circles in a simplified manner. FIG. 4 also displays 4×10 matrix-shaped memory cells MCs as one cell block as a part of the memory cell array 100. The matrix of the memory cells MCs can be a matrix of other than 4×10 cells.

A first cell block CB1 is included in a certain memory cell array, and data can be written into the entire memory cells MCs. Therefore, in the present embodiment, a sense amplifier S/A can access the entire memory cells MCs included in the first cell block CB1, at the data writing time or at the data reading time.

In a second cell block CB2 and a third cell block CB3, memory cells MCs and MC*s are arranged alternately in a checkered flag shape. In other words, the memory cells MCs are arranged alternately in the extension direction of the word lines WLs, and are also arranged alternately in the extension direction of the bit lines BLs. The memory cells MC*s are also arranged alternately in the extension direction of the word lines WLS, and are arranged alternately in the extension direction of the bit lines BLs. The memory cells MC*s are arranged between the memory cells MCs. The sense amplifier S/A can access the memory cells MCs, but is prohibited to access the memory cells MC*. In this example, configurations of the memory cells MCs and MC*s are the same.

The first to third cell blocks CB1 to CB3 can be the cell blocks included in the same memory cell array. With this arrangement, the first to third cell blocks CB1 to CB3 can share the sense amplifiers S/As. When the sense amplifiers S/As can be shared, data are not required to be read out from the sense amplifiers in an expansion operation described below. Therefore, the expansion operation can be finished in a short time.

However, the second and third cell blocks CB2 and CB3 can belong to memory cell arrays different from that of the first cell block CB1. In this case, preferably, the second and third cell blocks are included in a memory chip to which the first cell block belongs. When the first to third cell blocks CB1 to CB3 are included in the same memory chip, data can be expanded in a short time.

A cell block such as the first cell block CB1 of which entire memory cells MCs can be accessed is hereinafter called "entire access block". Cell blocks like such as second and third cell blocks CB2 and CB3 of which only memory cells MCs that are arranged in a diagonal direction in the lattice shape can be accessed are called "diagonal access blocks". The operation of the sense amplifiers S/As accessing the entire memory cells arranged at cross points of the lattice shape is called "entire access". Meanwhile, the operation of the sense amplifiers S/As accessing only memory cells MCs arranged in a diagonal direction in the lattice shape is called a "diagonal access".

Expansion Operation

Figure 5:
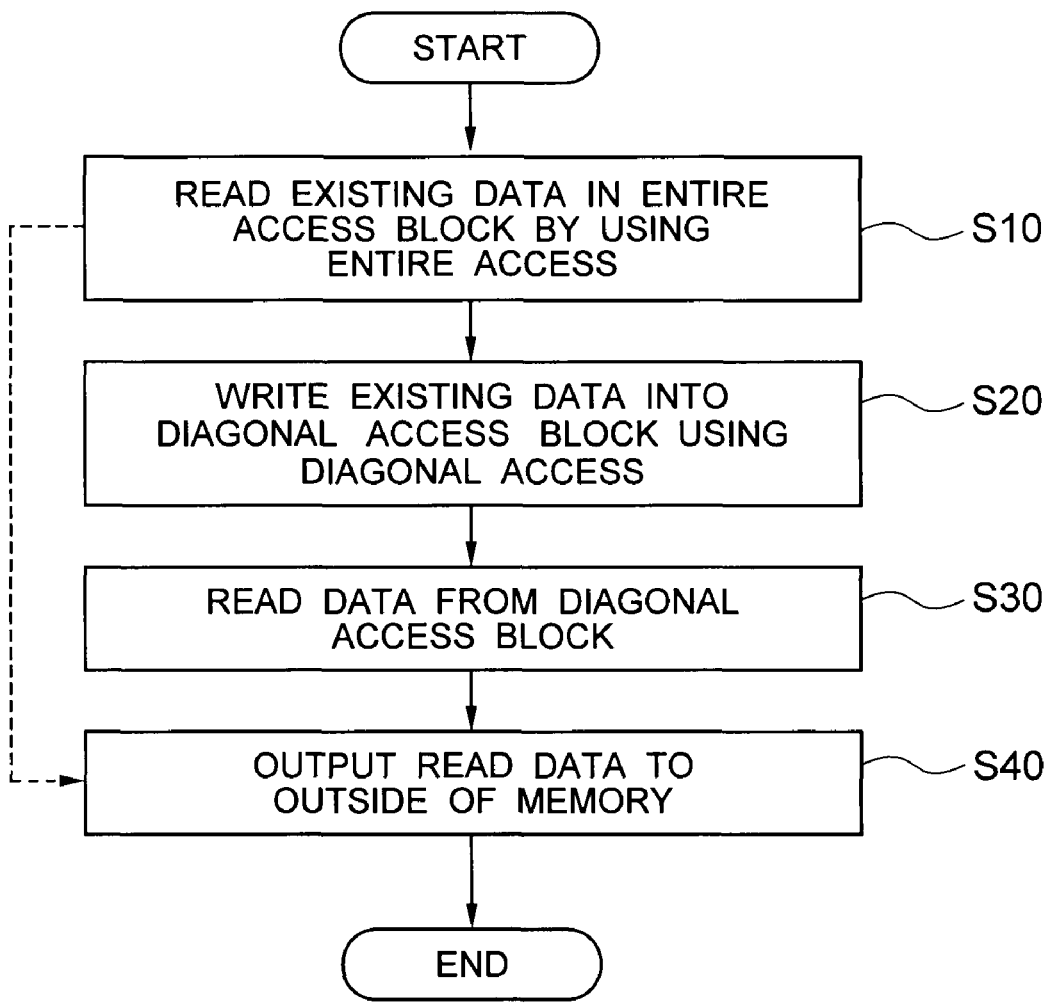
FIG. 5 is a flow diagram of the expansion operation and the read operation.

A data expansion operation is explained next. FIG. 5 is a flow diagram of the expansion operation and the read operation. In the present embodiment, the sense amplifier S/A once reads, using the entire access, existing data already stored in the first cell block CB1 as an entire access block (S10). The sense amplifier S/A further writes the existing data into the second and third cell blocks CB2 and CB3 as diagonal access blocks (S20) using the diagonal access.

Because the first cell block CB1 is an entire access block, this cell block can store data stored in two diagonal access blocks. On the other hand, when the existing data of the entire memory cells MCs of the first cell block CB1 are to be copied to the diagonal access block, two diagonal access blocks (CB2 and CB3) are necessary. As explained above, the operation of copying data of one entire access block to two diagonal access blocks is called "data expansion operation".

The data expansion operation is explained in further detail. The data write operation of writing data to the first cell block CB1 as the entire access block and the data read operation of reading data from the first cell block to the sense amplifier S/A are the same as the corresponding conventional operations, and therefore explanations thereof will be omitted.

One example of the write operation to write data to the diagonal access blocks CB2 and CB3 is explained. When a word line WLn corresponding to the second cell block CB2 shown in FIG. 4 is selected, for example, data are written into memory cells MCs connected to bit lines BLn−3, BLn−1, BLn+1, BLn+3, BLn+5 (hereinafter, also called "odd bit lines"). When a word line WLp corresponding to the third cell block CB3 is selected, data are written into the memory cells MCs connected to the odd bit lines.

When electrons are implanted into a floating gate (when "0" is written), the sense amplifier S/A applies 0 V to odd bit lines. When electrons are not implanted into the floating gate (when "1" is written), the sense amplifier S/A applies a high level potential (for example, a VDD (power source potential)) to the odd bit lines.

The selective gate line SGL1 corresponding to the NAND string NS to which data are to be written is at the high level potential VDD, and the corresponding selective gate line SGL is at a low level potential VSS. In this case, the selective transistor ST at the bit line side becomes in the on state, and the selective transistor ST at the source line side becomes in the off state.

When the word line WLn of the second cell block CB2 is selected, about 20 V is applied to the selective word line WLn as a writing voltage Vpgm. A voltage of about 10 V is applied to other non-selective word lines WLn−1, WLn+1, WLn+2, as an intermediate voltage Vpass. In this case, in the odd bit lines applied with 0 V, the selective transistor ST at the bit line side maintains the on state. With this arrangement, 0 V is applied to channels of the memory cells MCs connected to the selective word line WLn. A potential difference of about 20 V is generated between the control gate channels of the memory cells MCs. As a result, electrons are accumulated in the floating gate by an NF tunneling, and the writing of the data "0"0 is completed.

On the other hand, in the odd bit lines applied with VDD, a voltage (VDD-Vth_ST) which is a reduction of a threshold voltage (Vth_ST) of a selective transistor at the bit line side from VDD is applied to the channels of the memory cells MCs. When the channel potential becomes higher than the voltage (VDD-Vth_ST) due to the voltage of the selective word line WLn, the selective transistor ST at the bit line side becomes in the off state. As a result, a potential of the channels of the memory cells MCs is increased to a potential determined by a capacitance ratio of the selective word line WLn and the channels. As a result, electrons are not accumulated in the floating gate, and the floating gate maintains the data "1". In this way, data are written into the memory cells MCs arranged alternately among the memory cells MCs connected to a certain word line WL.

When the word line WLn is selected, bit lines BLn−4, BLn−2, BLn, BLn+2, BLn+4 (hereinafter, also called "even bit lines") are fixed to VDD. Therefore, a write operation is not performed in the memory cells corresponding to the even bit lines, and the entire memory cells maintain a writing non-selective state.

Next, when the word line WLn+1 is selected, the memory cells MC* connected to the odd bit lines are not accessed, and data are written into only the memory cells MCs connected to the even bit lines. Because the write operation in this case can be easily analogized from the above write operation, explanations thereof will be omitted. When the word line WLn+1 is selected, a potential of the odd bit lines is being fixed to VDD during a write operation. As explained above, the memory 10 according to the present embodiment writes data into the memory cells MCs using a diagonal access while selecting the word lines WLs in an assigned order, for example, an order of addresses.

A write operation of writing data to the third cell block CB3 is similar to the write operation to the second cell block CB2. Accordingly, data stored in the first cell clock CB1 can be expanded to the second and third cell blocks CB2 and CB3.

After performing the expansion operation, the data in the first cell block can be erased or can be held as they are. When the data in the first cell block CB1 are erased, new data can be written into the first cell block CB1. When the data in the first cell block CB1 are held as they are, the data in the second and third cell blocks CB2 and CB3 can be erased, after the data in the second and third cell blocks CB2 and CB3 are used. After the data in the second and third cell blocks CB2 and CB3 are erased, data in an entire access block different from the first cell block CB1 can be expanded to the second and third cell blocks CB2 and CB3. Preferably, frequently-accessed data are previously expanded in the second and third cell blocks CB2 and CB3.

For example, data with a large number of access times can be expanded to a diagonal access block with priority. Alternatively, recently-accessed data can be expanded to a diagonal access block. Conversely, data with a small number of access times and old data with a longest time elapsed since the recent access are stored in only an entire access block as data of small access probability and are not expanded to a diagonal access block. Alternatively, data already expanded to a diagonal access block are erased. With this arrangement, the diagonal access block and the entire access block can be used efficiently.

Whether to store old data is determined using a flag provided in each diagonal access block (or in each word line). When there is a reading access, a flag of this block is set. A diagonal access block having no flag set after a lapse of a predetermined time is determined as a diagonal access block having no recent access. Data of a diagonal access block having no recent access is erased with priority. A method of assigning a diagonal access block which has not been accessed for a longest time is called an LRU (Least Recent Used) method. A flag used in the LRU method is hereinafter called an LRU flag. By cyclically repeating a check of this LRU flag, a diagonal access block is effectively used. In the LRU method, data to be copied in the expansion operation are preferably copied after being corrected using an ECC (Error Correcting Code) function performed by the NAND controller 220 or the like.

Read Operation

One example of a data read operation from the memory 10 according to the present embodiment is explained. In the read operation, data are not read from the first cell block CB1 as the entire access block, but data are read from the second and third cell blocks CB2 and CB3 as diagonal access blocks (S30). The sense amplifier S/A outputs the read data to the outside of the memory 10 (S40).

For example, data in the memory cells MCs connected to the word line WLn of the second cell block CB2 are read. In this case, 0 V is applied to the selective word line WLn, and about 4.5 V is applied to the non-selective word lines WLn−1, WLn+1, WLn+2. With this arrangement, the data in the memory cells MCs connected to the selective word line WLn can be read without destroying the data in the memory cells MCs connected to the non-selective word lines. In this case, both the selective transistor ST at the bit line side and the selective transistor ST at the source line side are in the on state.

In the data read operation, all sense amplifiers S/As can be activated, and data in the entire bit lines corresponding to the selective word line can be read. In this case, only sense amplifier data corresponding to a dialog access (corresponding to even bit lines or odd bit lines) are activated. Other data are not transmitted to the next stage, and are discarded.

As another data read operation, the sense amplifier S/A does not need to access the memory cells MC*s. When the word line WLn is selected, only the data in the memory cells MCs connected to the odd bit lines are read out, and the data in the memory cells MC*s connected to the even bit lines are not read out. In this case, the sense amplifiers connected to the even bit lines can be in the inactive state to decrease power consumption. When the word line WLn+1 is selected, only the data in the memory cells MCs connected to the even bit lines are read out, and the data in the memory cells MC*s connected to the odd bit lines are not read out. In this case, the sense amplifiers connected to the odd bit lines can be in the inactive state to decrease power consumption. In this way, because data are not read out from half bit lines in the read operation, a potential can be fixed. The bit lines at the fixed potential function as a shield to the bit lines from which data are read. Therefore, the bit lines from which data are read can be operated in a stable state.

The diagonal access block and the entire access block can be discriminated from each other by providing an identification flag (single bit data) to each block. Identification flags of diagonal access and entire access are different flags from the above LRU flags. The identification flags of the diagonal access and the entire access are stored in the ROM 120 shown in FIG. 1. Existing flags provided in respective word lines can be used. In this case, the entire access method and the diagonal access method can be distinguished in a word line unit.

Activated amplifiers are determined by the flag information. For example, data are read out to either the sense amplifiers connected to the odd bit lines or the sense amplifiers connected to the even bit lines, corresponding to addresses of the selective word lines of the diagonal access blocks. Either a part of data or entire data out of the data read out to the sense amplifier are read from the sense amplifier to the outside of the memory 10.

The entire access block or the diagonal access block can be assigned/changed by an address from the NAND controller 220 or by an external host. Alternatively, the entire access block and the diagonal access block can be assigned/changed in the order of addresses. Further, the diagonal access block can be address-assigned/changed at random. By assigning/changing the diagonal access block in the order of addresses or at random, a degradation state of the memory cells can be averaged in each block.

In the diagonal access block according to the present embodiment, data are stored in only the memory cells MCs arranged alternately in each extension direction of the word lines and the bit lines. Therefore, the data read operation can be performed at a high speed. More specifically, the number of valid memory cells MCs storing data in the diagonal access block is approximately one half of the number of valid memory cells MCs in the entire access block. Because the half memory cells MC*s in the NAND string NS are maintained in the erased state, back pattern noise by data of the non-selective memory cells is suppressed to one half or below. Because a threshold voltage of the memory cells MC*s is maintained at a low level, the amount of cell current flowing through the NAND string increases. When the amount of the cell current increases, a signal difference necessary for the sense amplifier S/A to detect data can be obtained in a short time. Therefore, a data reading speed becomes fast. Further, a margin of read data (a signal difference of data) can be increased. Further, because an S-factor (a sub-threshold characteristic) is improved, a stable high-speed operation is possible.

When the proximity effect is large like that in the conventional practice, there have been cases that a reading method to correct the proximity effect is necessary. For example, when data are read out from the memory cells MCs connected to a selective word line WLm using a entire access array method usually used in a nonvolatile memory, the proximity effect needs to be cancelled based on the data of an adjacent word line WLm+1. To cancel the proximity effect, there is also a reading method to perform a data correction in the selective word line WLm.

However, because the proximity effect is small in the read operation according to the present embodiment, this data correction is not necessary. As a result, the data reading speed becomes faster.

Further, as a modification of the operation shown in FIG. 5, the operation directly shifting from step S10 to S40 can be performed in parallel with the operation at steps S20 and S30, as shown by a broken line in FIG. 5. In this case, existing data written in the entire access block are read by the entire access, and the read data are directly output to the outside of the memory at S40. Simultaneously with this operation, the write operation to write data directly into the diagonal access block using the diagonal access, that is, an expansion operation, is performed at step S20. Actually, after the data are read to the sense amplifier at step S10, the data are output at step S40. The data are written into the diagonal access block, using the sense amplifier data at step S20. When the read operation and the expansion operation are performed simultaneously in parallel in this way, the reading time and the expansion time can be saved. The second and subsequent read operations are performed from the diagonal access block. Therefore, the reading speed is increased at the second and subsequent read operation.

A data erasing operation is performed for each block in a similar manner to that in the conventional practice, and therefore detailed explanations of the operation will be omitted.

While the memory cells MCs according to the present embodiment can store binary data as described above, the memory cells MCs can also store multi-value data in place of the binary data. One example (an LM (Lower Middle) method) of operation of writing four-value data (2-bit data) into the memory cells MCs is explained below.

Figure 6:
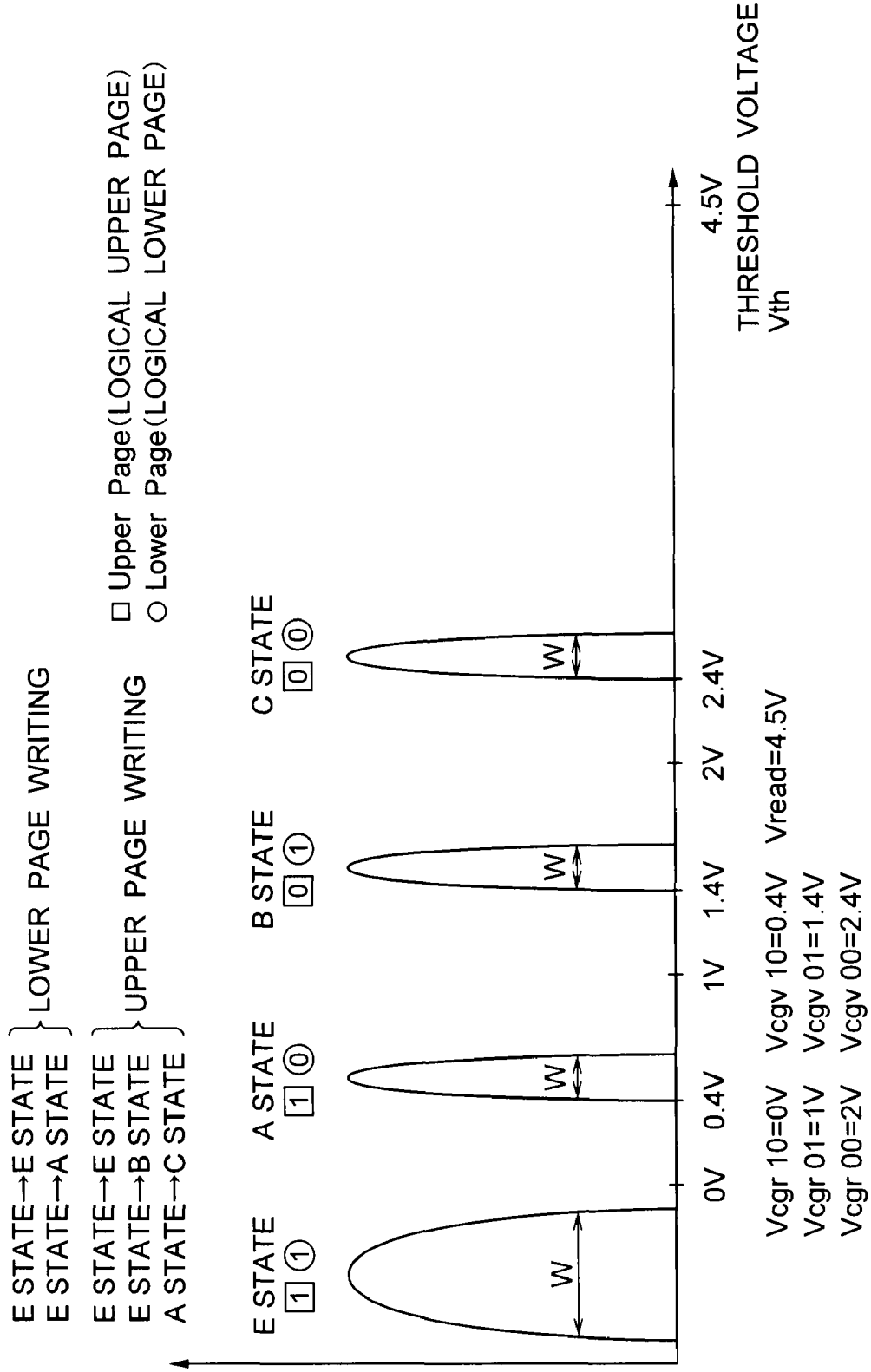
FIG. 6 is a graph showing a threshold voltage of the memory cells MCs storing four-value data.

FIG. 6 is a graph showing a threshold voltage of the memory cells MCs storing four-value data. The memory cells MCs store one of four-value data (11, 10, 01, 00). Lower bits of the four-value data are stored as Lower Page data into each memory cell MC, and upper bits are stored as Upper Page data into each memory cell MC. In FIG. 6, the Lower Page data are shown by circles, and the Upper Page data are shown by squares. A vertical axis represents the number of the memory cells MCs. Therefore, widths Ws of the graph in various states in FIG. 6 show variations. Accordingly, preferably, the widths Ws of the graph in various states are small.

An E state (11) is an Erase state, and this is a state in which the data "0" is not written as the Lower Page data and the Upper Page data. Before the data is written, the entire memory cells MCs are in the E state. In the E state, a threshold voltage of the memory cells MCs is negative. Other states, an A state to a C state, are states in which a threshold voltage is in the writing state of writing data into the memory cells MCs, and a positive voltage between 0 V to 5 V is allocated to the memory cells MCs.

A writing of the four-value data is performed in two operations of Lower Page writing and Upper Page writing. The Lower Page writing determines Lower Page data. As a result, a data state of the memory cells MCs is allocated to the E state and the B state, or the A state and the C state. The Upper Page writing determines Upper Page data. As a result, a data state of the memory cells MCs is allocated to any one of the E state, the B state, the A state, and the C state.

In the Lower Page writing, when the Lower Page data is to be kept at 1, the bit lines are set to a high level, thereby preventing electrons from being accumulated in the floating gates of the memory cells MCs connected to the selective word line. With this arrangement, the memory cells MCs maintain the E state (the erase state). On the other hand, at the time of writing 0 for the Lower Page data, the bit lines are set to a low level, thereby accumulating electrons in the floating gates of the memory cells MCs connected to the selective word line. With this arrangement, 0 is written for the Lower Page data, and the memory cells MCs are set to the A state.

In the Upper Page writing, when the Upper Page data are to be kept at 1, the bit lines are set to a high level, thereby preventing electrons from being accumulated in the floating gates of the memory cells MCs connected to the selective word line. With this arrangement, the memory cells MCs in the E state maintain the E state (the erase state), and the memory cells MCs in the A state maintain the A state. On the other hand, at the time of writing 0 for the Upper Page data, the bit lines are set to a low level, thereby accumulating electrons in the floating gates of the memory cells MCs connected to the selective word line. When 0 is written into the Upper Page of the memory cells MCs in the E state, the memory cells MCs become in the B state. When 0 is written into the Upper Page of the memory cells MCs in the A state, the memory cells MCs become in the C state. In this case, a voltage of the selective word line is set higher than a voltage of the selective word line in the Lower Page writing. Alternatively, a voltage of the bit lines is set lower than a voltage of the bit lines in the Lower Page writing. With this arrangement, in the 0 writing in the Upper Page, the amount of electrons accumulated in the floating gate is larger than that of the 0 writing in the Lower Page. As a result, the threshold voltage of the memory cells MCs in the B state becomes higher than the threshold voltage of the memory cells MCs in the A state, thereby making it possible to distinguish between the A state (10) and the B state (01). In this way, the memory cells MCs can become in the four states of E, A, B, and C based on the threshold voltage.

Vcgr10 is a voltage applied to the control gate to distinguish between the data (10) and (11) at the reading time. Vcgr01 is a voltage applied to the control gate to distinguish between the data (01) and (10) at the reading time. Vcgr00 is a voltage applied to the control gate to distinguish between the data (00) and (01) at the reading time. For example, when a threshold voltage is smaller than Vcgr10 (0 V), the memory cells MCs are in the E state (11). When a threshold voltage is smaller than Vcgr01 (1 V) in cells excluding cells which are determined to be in the E state, the memory cells MCs are in the A state (10), and when the threshold voltage is smaller than Vcgr00 (2 V), the memory cells MCs are in the B state (10). Other cells are determined to be in the C state.

Vcgv10 shown in FIG. 6 is also a voltage applied to the control gate at a verify read time of the data (10), and this voltage is set by taking a constant margin (for example, 0.4 V) to Vcgr into account. Vcgv10 is 0.4 V, for example. Vcgv10 is a read voltage used to verify-read the data (01), and is 1.4 V, for example. Vcgv00 is a read voltage used to verify-read the data (00), and is 2.4 V, for example. Vread is a voltage applied to the control gate of a non-selective memory cell at the data reading time.

A reading of four-value data can be achieved at three reading steps. For example, at a first step, Vcgr10 (0 V) is applied to the control gate. As a result, the memory cells MCs in the E state can be detected. At a second step, Vcgr00 (2 V) is applied to the control gate. As a result, the memory cells MCs in the C state can be detected. At a third step, Vcgr01 (1 V) is applied to the control gate. As a result, the memory cells MCs in the A state and the B state can be detected.

In the present embodiment, the entire access block can store multi-value data, and the diagonal access block can store binary data. When the entire access block stores multi-value data, the memory 10 can store large-capacity data. When the diagonal access block stores binary data, the memory 10 can perform a high-speed read operation. When the first cell block CB1 stores four-value data, the existing four-value data can be expanded to four diagonal access blocks as binary data.

Alternatively, both the entire access block and the diagonal access block can store multi-value data. When the entire access block stores multi-value data, the memory 10 can store large-capacity data. When the diagonal access block stores multi-value data, a read operation becomes slow as compared with when the diagonal access block stores binary data. However, the influence of proximity effect in the diagonal access block is smaller than that in the diagonal access block. Therefore, the read operation of reading data from the diagonal access block is faster than the read operation of reading data from the entire access block. Accordingly, even when the diagonal access block stores multi-value data, the effect of the above expansion operation itself is not lost. Further, when each memory cell stores the same number of bits in both the entire access block and the diagonal access block, the controller can be easily designed.

The memory 10 according to the present embodiment expands the existing data stored in the entire access block to the diagonal access block, and reads data from the diagonal access block. In this way, in the read operation, the memory 10 does not directly access the entire access block, but accesses the diagonal access block holding the expanded data. Accordingly, data can be read using the diagonal access without receiving the influence of the proximity effect. Therefore, the read operation becomes fast. Because the entire access block can store data in the entire memory cell, the memory capacity of the memory 10 can be maintained in a large state.

Because the diagonal access block can increase a signal difference of data in a short time, the sense amplifier S/A can detect data correctly in a short time. Further, because the S-factor is improved in the diagonal access block, a stable high-speed read operation is possible. In the diagonal access block, an erroneous detection of data can be suppressed by shield effect of a non-access bit line.

The sense amplifier S/A according to the present embodiment can directly use a conventional sense amplifier as it is. That is, the function of the NAND chip in the present embodiment can be achieved by changing only the NAND controller 220.

While a flash memory has been mainly explained above, the present invention is effective for the entire memory elements having memory elements arranged in a lattice shape (for example, a resistance-change type memory). Generally, to meet the requirement for large capacity, memory elements of the memory device are continuously miniaturized, and an interval between the memory elements is also continuously decreased. In the miniaturization, negative influence of proximity effect due to adjacent memory cells becomes a problem without exception. In this case, the measure of eliminating the negative influence of the proximity effect using a larger distance in the diagonal direction than a distance in a cross direction is very effective. That is, the present invention can be applied not only to the flash memory described above, but also to the entire memory device arranged in a lattice shape as shown in FIG. 4. Needless to mention, the present invention can be applied to a volatile memory such as a DRAM as well as to a nonvolatile memory.

The invention claimed is:

1. A semiconductor memory device comprising:
   a plurality of word lines extending to a first direction;
   a plurality of bit lines extending to a second direction crossing the first direction;
   a memory cell array including a plurality of cell blocks each including a plurality of memory cells respectively provided corresponding to intersection points of the word lines and the bit lines; and
   sense amplifiers provided corresponding to the bit lines, the sense amplifiers reading data stored in the memory cells, or writing data into the memory cells, wherein
   the sense amplifiers copies existing data stored in a first cell block within the memory cell array to a plurality of memory cells, the memory cells being included in second and third cell blocks different from the first cell block, and alternately arranged in an extension direction of the word lines and also alternately arranged in an extension direction of the bit lines, and
   the sense amplifiers reads data from the second cell block or the third cell block, at a time of outputting data to outside of the sense amplifiers.

2. The semiconductor memory device according to claim 1, wherein the first cell block, the second cell block, and the third cell block share the sense amplifiers.

3. The semiconductor memory device according to claim 1, wherein the memory cells within the first cell block respectively store multi-bit data, and
   the memory cells within the second and third cell blocks respectively store single-bit data.

4. The semiconductor memory device according to claim 2, wherein the memory cells within the first cell block respectively store multi-bit data, and
   the memory cells within the second and third cell blocks respectively store single-bit data.

5. The semiconductor memory device according to claim 1, wherein the sense amplifiers copy existing data stored in the first cell block to a plurality of memory cells arranged in a checkered flag shape within the second and third cell blocks.

6. The semiconductor memory device according to claim 2, wherein the sense amplifiers copy existing data stored in the first cell block to a plurality of memory cells arranged in a checkered flag shape within the second and third cell blocks.

7. The semiconductor memory device according to claim 1, wherein in the second and third cell blocks, restricted memory cells are memory cells in which data reading or data writing is prohibited, the restricted memory cells being adjacent to accessible memory cells in an extension direction of the word lines or an extension direction of the bit lines, the accessible memory cells being memory cells from which data can be read or to which data can be written.

8. The semiconductor memory device according to claim 2, wherein in the second and third cell blocks, restricted memory cells are memory cells in which data reading or data writing is prohibited, the restricted memory cells being adjacent to accessible memory cells in an extension direction of the word lines or an extension direction of the bit lines, the accessible memory cells being memory cells from which data can be read or to which data can be written.

9. A method of driving a semiconductor memory device, the semiconductor memory device including: a plurality of word lines extending to a first direction; a plurality of bit lines extending to a second direction crossing the first direction; a memory cell array including a plurality of cell blocks each including a plurality of memory cells respectively provided corresponding to intersection points of the word lines and the bit lines; and sense amplifiers provided corresponding to the bit lines, the method comprising:
sensing existing data using the sense amplifier, the data being stored in a first block within the memory cell array;
writing the existing data into a plurality of memory cells using the sense amplifier, the memory cells being included in second and third cell blocks different from the first cell block and being alternately arranged in an extension direction of the word lines and also alternately arranged in an extension direction of the bit lines, and
reading data from the second cell block or the third cell block, at a time of outputting data to outside of the sense amplifiers.

10. The method of driving a semiconductor memory device according to claim 9, wherein
at a time of reading data stored in the first cell block, the sense amplifiers corresponding to each column of the first cell block are driven, and
at a time of reading data stored in the second or third cell block, only sense amplifiers alternately arranged among the sense amplifiers corresponding to columns of the second or third cell block are driven.

11. The method of driving a semiconductor memory device according to claim 9, wherein the memory cells within the first cell block respectively store multi-bit data, and
the memory cells within the second and third cell blocks respectively store single-bit data.

12. The method of driving a semiconductor memory device according to claim 10, wherein the memory cells within the first cell block respectively store multi-bit data, and
the memory cells within the second and third cell blocks respectively store single-bit data.

13. The method of driving a semiconductor memory device according to claim 9, wherein the sense amplifiers copy existing data stored in the first cell block to a plurality of memory cells arranged in a checkered flag shape within the second and third cell blocks.

14. The method of driving a semiconductor memory device according to claim 10, wherein the sense amplifiers copy existing data stored in the first cell block to a plurality of memory cells arranged in a checkered flag shape within the second and third cell blocks.

15. The method of driving a semiconductor memory device according to claim 9, wherein in the second and third cell blocks, restricted memory cells are memory cells in which data reading or data writing is prohibited, the restricted memory cells being adjacent to accessible memory cells in an extension direction of the word lines or an extension direction of the bit lines, the accessible memory cells being memory cells from which data can be read or to which data can be written.

16. The method of driving a semiconductor memory device according to claim 10, wherein in the second and third cell blocks, restricted memory cells are memory cells in which data reading or data writing is prohibited, the restricted memory cells being adjacent to accessible memory cells in an extension direction of the word lines or an extension direction of the bit lines, the accessible memory cells being memory cells from which data can be read or to which data can be written.

* * * * *